United States Patent
Oda et al.

(10) Patent No.: US 7,632,427 B2
(45) Date of Patent: *Dec. 15, 2009

(54) CONDUCTIVE PASTE AND MULTILAYER CERAMIC ELECTRONIC DEVICE AND ITS METHOD OF PRODUCTION

(75) Inventors: Kazuhiko Oda, Chuo-ku (JP); Tetsuji Maruno, Chuo-ku (JP); Shuichi Miura, Chuo-ku (JP); Makoto Takahashi, Chuo-ku (JP); Tatsuya Kojima, Chuo-ku (JP)

(73) Assignee: TDK Corporation, Tokyo (JP)

( * ) Notice: Subject to any disclaimer, the term of this patent is extended or adjusted under 35 U.S.C. 154(b) by 434 days.

This patent is subject to a terminal disclaimer.

(21) Appl. No.: 11/155,580

(22) Filed: Jun. 20, 2005

(65) Prior Publication Data
US 2006/0011896 A1    Jan. 19, 2006

(30) Foreign Application Priority Data
Jun. 28, 2004    (JP)    ............................. 2004-190268

(51) Int. Cl.
H01G 4/12    (2006.01)
H01B 1/22    (2006.01)

(52) U.S. Cl. ........................ 252/512; 427/96.1; 427/79; 361/321.2; 361/321.3; 501/134

(58) Field of Classification Search ................. 252/62.2, 252/62.3 R, 500, 512; 501/134–137; 156/89.11, 156/89.12; 264/614; 361/306.3, 321, 321.5; 427/123, 256, 372.2
See application file for complete search history.

(56) References Cited

U.S. PATENT DOCUMENTS

| 5,766,392 A | * | 6/1998 | Nakano .................... 156/89.17 |
| 6,548,437 B2 | * | 4/2003 | Sato et al. .................... 501/139 |
| 6,606,238 B1 | * | 8/2003 | Nakamura et al. ........ 361/321.2 |
| 6,673,272 B2 | | 1/2004 | Miyazaki et al. |
| 6,989,110 B2 | * | 1/2006 | Yonezawa et al. ............ 252/512 |
| 2006/0191443 A1 | * | 8/2006 | Yamaguchi et al. ......... 106/640 |

FOREIGN PATENT DOCUMENTS

| CN | 1331474 A | 1/2002 |
| JP | A 09-017687 | 1/1997 |
| JP | A 9-328570 | 12/1997 |
| JP | B2 2976268 | 9/1999 |

(Continued)

OTHER PUBLICATIONS

"Terpenes", Inst. of Chemistry, FU Berlin, Jul. 31, 2003, pp. 1-2.*

(Continued)

*Primary Examiner*—Stanley Silverman
*Assistant Examiner*—Kallambella Vijayakumar
(74) *Attorney, Agent, or Firm*—Oliff & Berridge, PLC (57) ABSTRACT

A conductive paste used for forming internal electrodes of a multilayer ceramic electronic device, used in combination with ceramic green sheets, each containing a butyral resin and having a thickness of 5 μm or less, and including a conductive powder and an organic vehicle, a solvent in said organic vehicle having terpineol acetate as its main ingredient, whereby there is little change in viscosity along with time and no occurrence of sheet attack.

4 Claims, 3 Drawing Sheets

FOREIGN PATENT DOCUMENTS

| | | |
|---|---|---|
| JP | A 2002-270456 | 9/2002 |
| JP | A 2003-318060 | 11/2003 |
| JP | A 2004-176120 | 6/2004 |
| WO | WO 2004/087608 | * 10/2004 |

OTHER PUBLICATIONS

"Terpineol Acetate", www.the goodscentscompany.com/data/rw1375491.html, Dec. 22, 2007; pp. 1-2.*

* cited by examiner

FIG. 1

CONDUCTIVE PASTE AND MULTILAYER CERAMIC ELECTRONIC DEVICE AND ITS METHOD OF PRODUCTION

BACKGROUND OF THE INVENTION

1. Field of the Invention

The present invention relates to a conductive paste used for forming internal electrodes of a multilayer ceramic electronic device, a multilayer ceramic electronic device produced using that paste, and a method of production of the device.

2. Description of the Related Art

In recent years, electronic apparatuses have been made thinner and smaller. Along with this, the multilayer ceramic electronic devices used for these electronic apparatuses are also being made smaller in size and higher in capacity.

The most effective method for reducing the size and increasing the capacity of a multilayer ceramic capacitor, explained here as an example of a multilayer ceramic electronic device, is to make both the internal electrodes and dielectric layers as thin as possible and stack as many of them as possible.

A multilayer ceramic capacitor is produced by printing ceramic green sheets having a ceramic powder such as barium titanate and a binder as main ingredients with a conductive paste for forming internal electrodes in predetermined patterns, stacking them, then simultaneously firing them to sinter them and then finally forming external electrodes.

As the conductive paste for forming the internal electrodes, one comprised of an organic binder dissolved in a solvent to form an organic vehicle into which a conductive powder is then dispersed is used. As the organic binder in the organic vehicle, for example ethyl cellulose etc. is used, while as the solvent in the organic vehicle, terpineol etc. is used.

However, if printing a conductive paste using terpineol as a solvent on a ceramic green sheet, the problem of seepage etc. occurred and electrode patterns accurately reduced to a predetermined thickness cannot be obtained.

Further, when using a conductive paste using terpineol as a solvent in combination with a ceramic green sheet using a butyral resin as an organic binder, the solvent in the conductive paste makes the organic binder in the ceramic green sheet swell or dissolve, i.e., the so-called "sheet attack" phenomenon occurs.

This sheet attack phenomenon does not become a practical problem while the ceramic green sheet is relatively thick. However, when the thickness of a ceramic green sheet is for example 5 μm or less, if the sheet attack phenomenon occurs, when printing the conductive paste, then peeling off the ceramic green sheet from a polyethylene terephthalate (PET) film or other carrier sheet, the ceramic green sheet becomes hard to peel off. If the ceramic green sheet becomes hard to peel off, this results in the ceramic green sheet wrinkling, being punctured, cracking, etc. and makes it impossible to obtain a normal stack in the stacking process. If a normal stack cannot be obtained, the finally obtained multilayer ceramic electronic device suffers from short-circuit defects, withstand voltage defects (IR deterioration), and the phenomenon of peeling between the dielectric layers and internal electrode layers (delamination) which in turn cause a drop in yield.

Therefore, in recent years, several means have been proposed for dealing with this sheet attack phenomenon. As a solvent which will not dissolve a butyral resin, Japanese Patent Publication (A) No. 9-17687 proposes to use dihydroterpineol, while Japanese Patent No. 2976268 proposes a conductive paste using dihydroterpineol acetate.

With dihydroterpineol or dihydroterpineol acetate, the solubility of the ethyl cellulose used as the organic binder is relatively good. Therefore, these might be effective for the improvement of the solubility.

However, the conductive pastes described in Japanese Patent Publication (A) No. 9-17687 and Japanese Patent No. 2976268 using dihydroterpineol or dihydroterpineol acetate as a solvent have the problem of a tendency to increase in viscosity along with time. Therefore, while the viscosity is as desired and the pastes can be formed on ceramic green sheets to a predetermined thickness at the start of printing, after the elapse of a predetermined time, the viscosity increases and the same thickness cannot be formed under the printing conditions of the start of printing. This problem tends to manifest itself when desiring to form the electrode patterns particularly thin.

Therefore, with such conventional conductive pastes, there were limits to the reduction of size and increase in capacity of multilayer ceramic electronic devices.

Note that Japanese Patent Publication (A) No. 2002-270456 proposes to suppress changes in viscosity of a conductive paste along with time by using as the solvent of the conductive paste isobonyl acetate or nopyl acetate.

SUMMARY OF THE INVENTION

An object of the present invention is to provide a conductive paste used for forming internal electrodes of a multilayer ceramic electronic device, with little change in viscosity over time, and not suffering from sheet attack, a multilayer ceramic electronic device produced using the paste, and a method of production of the device.

The inventors discovered that by using for the conductive paste one of the terpenes as a specific solvent, there is little change in viscosity along with time and as a result the change in thickness along with time at the time of electrode formation can be suppressed. Further, they discovered that by using this solvent, as a secondary effect, it is possible to prevent sheet attack.

That is, according to the present invention, there is provided a conductive paste used for forming internal electrodes of a multilayer ceramic electronic device, used in combination with ceramic green sheets including a butyral resin and having a thickness of 5 μm or less and including a conductive powder and an organic vehicle, a solvent in the organic vehicle having terpineol acetate as its main ingredient.

According to the present invention, there is provided a multilayer ceramic electronic device produced using a green ceramic stack comprised of ceramic green sheets, each containing a butyral resin and having a thickness of 5 μm or less and a predetermined pattern of conductive paste containing terpineol acetate, alternately stacked in a plurality of layers and having internal electrode layers and 3 μm or less dielectric layers.

According to the present invention, there is provided a method of production of a multilayer ceramic electronic device comprising firing a green ceramic stack comprised of ceramic green sheets, each containing a butyral resin and having a thickness of 5 μm or less and a predetermined pattern of conductive paste containing terpineol acetate, alternately stacked in a plurality of layers.

According to the present invention, there is provided a method of use of terpineol acetate comprising using it for the solvent of a conductive paste used for forming internal electrodes of a multilayer ceramic electronic device.

Preferably, the solvent in the organic vehicle is contained in an amount of 50 to 200 parts by weight with respect to 100 parts by weight of the conductive powder.

The conductive paste of the present invention normally contains, along with the solvent, an organic binder as an ingredient of the organic vehicle. Therefore, preferably, the organic binder in the organic vehicle has ethyl cellulose as its main ingredient and is contained in an amount of 1 to 10 parts by weight with respect to 100 parts by weight of the conductive powder.

In the conductive paste of the present invention, the conductive powder should be one which can withstand the firing temperature and atmosphere when simultaneously firing it with the ceramic green sheets. For example, when the multilayer ceramic electronic device is a multilayer ceramic capacitor, a powder of Ag, Pd, Ni, etc. alone or in mixtures or alloys may be used. In particular, one having Ni or an Ni alloy as its main ingredient is preferable. When the multilayer ceramic electronic device is a multilayer ceramic board, a powder of Ag, Pd, Cu, etc. alone or in mixtures or alloys may be used.

The conductive paste of the present invention may also, in accordance with need, contain a plasticizer or a dispersant or another additive.

EFFECTS OF THE INVENTION (1) The terpineol acetate used for the solvent of the conductive paste in the present invention sufficiently dissolves the ethyl cellulose generally used for the organic binder of a conductive paste (rheology is good). Therefore, the conductive paste using the present solvent has little change in viscosity along with the elapse of time. The level of solubility can be judged for example by the creep characteristic, tan δ, etc., but the conductive paste of the present invention is superior in the creep characteristic and tan δ (see examples). Therefore, it is believed that the ethyl cellulose contained in the conductive paste as an organic binder is easily adsorbed by the conductive powder and is stable in dispersion and as a result there is less change of viscosity of the conductive paste along with time. By there being less change in viscosity over time, it is possible to suppress the change in thickness along with time at the time of formation of the electrodes.

Note that the creep characteristic and the tan δ both become indicators for judgment of the solubility. If dropping paste of a certain viscosity on a base material etc., the paste dropped on the base material naturally tends to become flat (to become level). The creep characteristic is an indicator showing the ease of leveling of this paste. If the creep characteristic is good, it means that the leveling ability is superior and it is believed that in turn the solubility is high (dissolves well). The inventors discovered that the terpineol acetate used in the present invention is much more superior in creep characteristic compared with terpineol, dihydroterpineol, dihydroterpineol acetate, etc. (see FIG. 2).

The tan δ is an indicator for judging the dynamic viscoelasticity. The lower the tan δ value, the more elastic and the harder the leveling. On the other hand, the higher the tan δ value, the less elastic and the easier the leveling. The larger the tan δ, the better the dynamic viscoelasticity, that is, the better the leveling ability and in turn the higher the solubility. The inventors discovered that the terpineol acetate used in the present invention has a higher and better tan δ compared with the nonsoluble dihydroterpineol or dihydroterpineol acetate other than terpineol (see FIG. 3).

(2) Further, the terpineol acetate used for the solvent of the conductive paste in the present invention does not cause the butyral resin contained as an organic binder in the ceramic green sheet to dissolve or swell (nonsoluble). Therefore, the conductive paste used in the present solvent, while secondarily, also has the effect of preventing sheet attack. Therefore, even if the thickness of the ceramic green sheet is for example a thin one of 5 μm or less, when printing the conductive paste, then peeling off the ceramic green sheet from a PET film or other carrier sheet, the peelability of the ceramic green sheet is improved and the ceramic green sheet wrinkling, being punctured, cracking, etc. can be effectively suppressed. That is, even if making the ceramic green sheet even thinner than now, no sheet attack phenomenon will occur. As a result, a normal stack is obtained even if using ceramic green sheets of extremely thin thicknesses of 5 μm or less and the finally obtained multilayer ceramic electronic device is no longer liable to suffer from short-circuit defects, withstand voltage defects (IR deterioration), or delamination between the dielectric layers and the internal electrode layers. From the above (1) and (2), the conductive paste of the present invention is extremely advantageous for reducing the size and raising the capacity of the finally obtained multilayer ceramic electronic device.

That is, according to the present invention, there are provided a conductive paste used for forming internal electrodes of a multilayer ceramic electronic device, with little change in viscosity along with the elapse of time, and free from sheet attack, a multilayer ceramic electronic device produced using the paste, and method of production of that device.

The multilayer ceramic electronic device is not particularly limited, but a multilayer ceramic capacitor, multilayer ceramic inductor, multilayer ceramic LC device, multilayer ceramic board, etc. may be illustrated.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, the present invention will be explained based on the embodiment shown in the drawings. In the present embodiment, as the multilayer ceramic electronic device, a multilayer ceramic capacitor will be illustrated.

Multilayer Ceramic Capacitor

Figure 1:
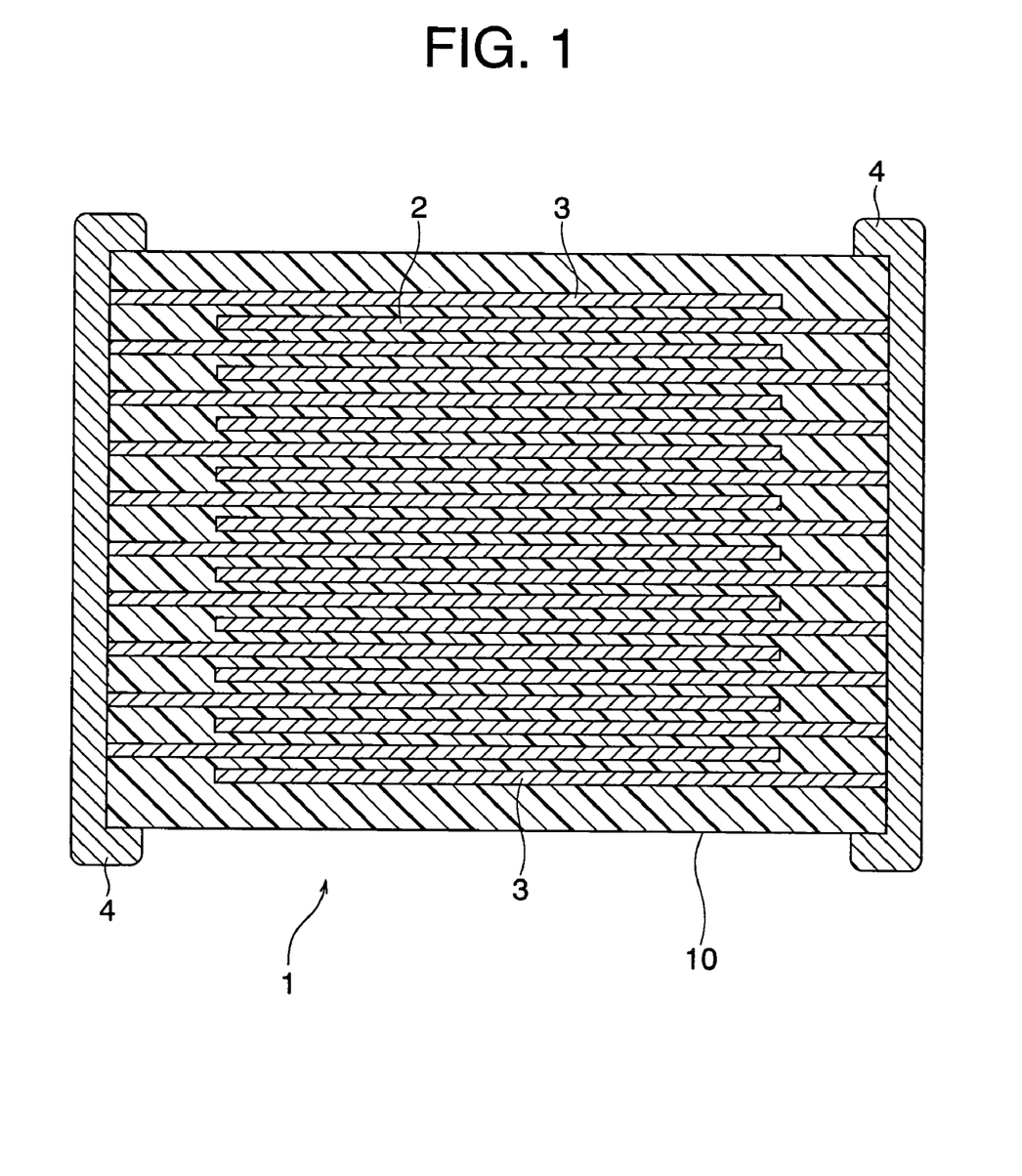
FIG. 1 is a cross-sectional view of a multilayer ceramic capacitor according to one embodiment of the present invention.

As shown in FIG. 1, the multilayer ceramic capacitor 1 according to an embodiment of the present invention has a capacitor body 10 comprised of dielectric layers 2 and internal electrode layers 3 alternately stacked. This capacitor body 10 is formed at its two side ends with a pair of external electrodes 4, 4 connected to the internal electrode layers 3 alternately arranged inside the body 10. The internal electrode layers 3 are stacked so that the side end faces are alternately exposed at the surfaces of the two facing ends of the capacitor body 10. The pair of external electrodes 4, 4 are formed at the two ends of the capacitor body 10 and are connected to the exposed end faces of the alternately arranged internal electrode layers 3 to form a capacitor circuit.

The external shape and dimensions of the capacitor body 10 are not particularly limited and may be suitably set in accordance with the application. Usually, the external shape is made a substantially parallelopiped shape and the dimensions are made normally (0.4 to 5.6 mm)×(0.2 to 5.0 mm)× (0.2 to 1.9 mm) or so.

The dielectric layers 2 are formed by firing the later explained ceramic green sheets. They are not particularly limited in material. For example, they may be formed by calcium titanate, strontium titanate, and/or barium titanate or another dielectric material. The thickness of each of the dielectric layers 2 is, in the present embodiment, preferably reduced to 3 µm or less, more preferably 2 µm or less.

The internal electrode layers 3 are formed by firing the later explained predetermined patterns of conductive paste. The thickness of each of the internal electrode layers 3 is preferably reduced to 2 µm or less, more preferably 1 µm or less.

The material of the external electrodes 4 used is usually copper or a copper alloy, nickel or a nickel alloy, etc., but silver or an alloy of silver and palladium etc. can also be used. The thickness of each of the external electrodes 4 is not particularly limited, but usually is 10 to 50 µm or so.

Method of Production of Multilayer Ceramic Capacitor

Next, an example of the method of production of a multilayer ceramic capacitor 1 according to the present embodiment will be explained.

Preparation of Dielectric Paste (1) First, to produce the ceramic green sheets for forming the dielectric layers 2 shown in FIG. 1 after firing, a dielectric paste is prepared.

In the present embodiment, the dielectric paste is comprised of an organic solvent-based paste obtained by kneading a ceramic powder (dielectric material) and an organic vehicle.

As the ceramic powder, various compounds giving a complex oxide or oxide, for example, a carbonate, nitrate, hydroxide, or organometallic compound, may be suitably selected from and mixed for use. The ceramic powder is usually used as a powder having an average particle size of 0.4 µm or less, preferably 0.1 to 3.0 µm or so. Note that to form extremely thin ceramic green sheets, it is preferable to use a powder finer than the ceramic green sheet thickness.

The organic binder used in the organic vehicle, in this embodiment, is polyvinyl butyral. The polymerization degree of the polyvinyl butyral is preferably 300 to 2400, more preferably 500 to 2000. Further, the butyralation degree of the resin is preferably 50 to 81.6%, more preferably 63 to 80%. The amount of residual acetyl groups is preferably 6% or less, more preferably 3% or less.

The organic solvent used in the organic vehicle is also not particularly limited, but terpineol, butyl carbitol, acetone, toluene, etc. may be used.

The contents of the ingredients in the dielectric paste are not particularly limited, for example, the dielectric paste may be prepared so as to contain about 1 to about 50 wt % of a solvent.

The dielectric paste may, in accordance with need, contain additives selected from various types of dispersants, plasticizers, dielectrics, sub ingredient compounds, glass frit, insulators, etc. When the dielectric paste contains these additives, the total content is preferably made about 10 wt % or less.

In the present embodiment, since the organic binder in the organic vehicle used is polyvinyl butyral, the content of the plasticizer in this case is preferably about 25 to about 100 parts by weight with respect to 100 parts by weight of the binder.

Formation of Ceramic Green Sheets (2) Next, this dielectric paste is coated by the doctor blade method etc. on carrier sheets to a thickness of preferably 0.5 to 30 µm, more preferably 0.5 to 10 µm, still more preferably 0.5 to 5 µm or so, to form ceramic green sheets. The ceramic green sheets form the dielectric layers 2 shown in FIG. 1 after firing.

As the carrier sheets, for example, PET films etc. are used. For improving the peelability, sheets coated with silicone etc. are preferable. The thickness of the carrier sheets is not particularly limited, but is preferably 5 to 100 µm.

The ceramic green sheets are dried after being formed on the carrier sheets. The drying temperature of the ceramic green sheets is preferably 50 to 100° C., while the drying time is preferably 1 to 20 minutes.

The thickness of the dried ceramic green sheets shrinks to a thickness of 5 to 25% that of the thickness before drying. In this embodiment, the dried ceramic green sheets are formed to give thicknesses of 5 µm or less, preferably 3 µm or less. This is so as to meet the demands for greater thickness of recent years.

Formation of Electrode Layers (3) Next, the surfaces of the ceramic green sheets formed on the carrier sheets are formed with the predetermined patterns of the electrode layers (internal electrode patterns) giving the internal electrode layers 3 shown in FIG. 1 after firing.

The thickness of each of the electrode layers is 2 µm or less, preferably 0.5 to 1.5 µm. If the electrode layers are too thick, it is necessary to reduce the number of layers stacked and the obtained capacity becomes smaller and increasing the capacity becomes difficult. On the other hand, if they are too thin, uniform formation is difficult and electrode breakage easily occurs.

The thickness of the electrode layers is, in the current art, in the above range or so, but the thinner the better in a range where electrode breakage does not occur.

The method of formation of the electrode layers is not particularly limited so long as it is a method which can form such layers uniformly, but in the present embodiment, the screen printing method using a conductive paste is used.

The conductive paste used in the present embodiment contains a conductive powder and an organic vehicle.

The conductive powder is not particularly limited, but it is preferably comprised of at least one ingredient selected from Cu, Ni, and their alloys, more preferably Ni or an Ni alloy and mixtures of the same.

Among the Ni and Ni alloy, an alloy of at least one element selected from Mn, Cr, Co, and Al and Ni is preferable. The content of Ni in the alloy is preferably at least 95 wt %. Note that the Ni or Ni alloy may also contain P, Fe, Mg, or other various trace ingredients in amounts of 0.1 wt % or so or less.

This conductive powder is spherical, flake shaped, etc. It is not particularly limited in shape and may be a mixture of these shapes as well. Further, the particle size of the conductive powder is usually, in the case of a spherical shape, an average particle size of 0.5 µm or less, preferably 0.01 to 0.4 µm or so. This is so as to more reliably realize thinner layers.

The conductive powder is contained in the conductive paste in an amount of preferably 30 to 60 wt %, more preferably 40 to 50 wt %.

The organic vehicle contains an organic binder and solvent as main ingredients.

The organic binder, in the embodiment, has ethyl cellulose as its main ingredient. The content of the ethyl cellulose in the organic binder is preferably 95 wt % or more, more preferably 100 wt %. While very small in amount, as a resin able to be used in combination with the ethyl cellulose, there is an acrylic resin etc.

The organic binder is contained in the conductive paste in an amount of preferably 1 to 10 parts by weight with respect to 100 parts by weight of the conductive powder. If the amount of the binder is too small, the film strength after printing tends to fall, while if too large, the metal filling density of the electrode patterns before firing falls and the flatness of the internal electrodes formed after firing cannot be maintained.

The solvent has terpineol acetate as a main ingredient. The content of the terpineol acetate in the solvent is preferably at least 95 wt %, more preferably 100 wt %. While small in amount, as a solvent able to be used in combination with the terpineol acetate, there is terpineol, dihydroterpineol, etc.

The solvent is contained in the conductive paste in an amount of preferably 50 to 200 parts by weight, more preferably 80 to 100 parts by weight with respect to 100 parts by weight of the conductive powder. If the amount of the solvent is too small, the viscosity of the paste becomes too high, while if too large, the viscosity of the paste becomes too low.

The total content of the organic binder and solvent in the organic vehicle is preferably at least 95 wt %, more preferably 100 wt %. While very small in amounts, as ingredients able to be included together with the organic binder and solvent in the organic vehicle, there are plasticizers, leveling agents, etc.

The conductive paste may also contain ceramic powder the same as the ceramic powder contained in the dielectric paste as a co-ingredient. The co-ingredient has the action of suppressing sintering of the conductive powder in the firing process. The ceramic powder (co-ingredient) is contained in the conductive paste in an amount of preferably 5 to 30 parts by weight with respect to 100 parts by weight of the conductive powder. If the amount of co-ingredient is too small, the effect of suppression of sintering of the conductive powder falls, the line property (continuity) of the internal electrodes deteriorates, and the apparent dielectric constant falls. On the other hand, if the amount of the co-ingredient is too great, the line property of the internal electrodes easily deteriorates and the apparent dielectric constant also tends to drop.

To improve the bonding, the conductive paste may contain a plasticizer. As the plasticizer, benzylbutyl phthalate (BBP) or another phthalic acid ester, adipic acid, phosphoric acid ester, glycol, etc. may be mentioned. In the present embodiment, preferably dioctyl adipate (DOA), butyl phthalate butylene glycol (BPBG), didodecyl phthalate (DDP), dibutyl phthalate (DBP), benzylbutyl phthalate (BBP), dioctyl phthalate (DOP), dibutyl sebacate, etc. may be used. Among these, dioctyl phthalate (DOP) is particularly preferable. The plasticizer is contained in an amount of preferably 25 to 150 parts by weight, more preferably 25 to 100 parts by weight, with respect to 100 parts by weight of the organic binder in the organic vehicle. Due to the addition of the plasticizer, the bond strength of the electrode layers formed using this paste rises and the bond strength of the electrode layers and green sheets rises. To obtain this effect, the amount of addition of the plasticizer is preferably at least 25 parts by weight. However, if the amount added exceeds 150 parts by weight, excess plasticizer seeps out from the electrode layers formed using this paste, so this is not preferred.

The viscosity of the conductive paste, in the case of using a Brookfield VISCMETR HBDVI+ for measurement under conditions of a spindle ($SC_{4-14}$)/chamber (6R), a liquid temperature of 25° C., and a slide speed of 4 $S^{-1}$, is preferably 1 to 20 Pa·s, more preferably 3 to 15 Pa·s. If the viscosity is too low, it will seep out, while if too high, there will be the trouble of pattern gaps and remaining mesh marks. The conductive paste of this embodiment includes terpineol acetate as a solvent and has little change in viscosity along with the elapse of time. Specifically, the rate of change of viscosity when measuring the viscosity V0 at the time of preparation, the viscosity V1 after standing for 1 day, the viscosity V7 after standing for 7 days, and the viscosity V30 after standing for 30 days is extremely small, that is, the change in viscosity along with time is suppressed.

The conductive paste can be obtained by kneading the above ingredients by a ball mill etc. to obtain a slurry.

Preparation, Firing, etc. of Green Chip (4) Next, a plurality of such green sheets formed with predetermined patterns of electrode paste layers on their surfaces are stacked to prepare a green chip which is then subjected to a binder removal process, firing process, and in accordance with need an annealing process to form a sintered body forming a capacitor body 10 which is then printed or transferred with an external electrode paste which is fired to form external electrodes 4, 4 and thereby produce a multilayer ceramic capacitor 1.

Actions and Effects of Embodiment

In the present embodiment, terpineol acetate is used as the solvent of the conductive paste. Therefore, there is less change in viscosity of the conductive paste along with time and the change in thickness along with time at the time of electrode formation can be suppressed.

Further, in this embodiment, the terpineol acetate used for the solvent of the conductive paste does not cause the polyvinyl butyral contained as an organic binder in the ceramic green sheet to swell or dissolve. That is, it does not cause sheet attack, so even if the thickness of the ceramic green sheets is for example a thin 5 μm or less, when printing the conductive paste, then peeling off the ceramic green sheets from the carrier sheets, the peelability of the ceramic green sheets is improved and the ceramic green sheets wrinkling, being punctured, cracking, etc. can be effectively suppressed. That is, even if the ceramic green sheets are made thinner than ever before, the phenomenon of sheet attack never occurs. As a result, even if using extremely thin ceramic green sheets with a thickness of 5 μm or less, a normal multilayer body is obtained and the finally obtained multilayer ceramic electronic device is less liable to suffer from short-circuit defects, withstand voltage defects (IR deterioration), and delamination between the dielectric layers and internal electrode layers.

Due to the above, the conductive paste of the present embodiment is extremely advantageous for reducing the size and raising the capacity of the finally obtained electronic device.

Other Embodiments

Above, an embodiment of the present invention was explained, but the present invention is not limited to the above embodiment in any way and can be modified in various ways within a range not outside of the gist of the present invention.

For example, in the above-mentioned embodiment, a multilayer ceramic capacitor was illustrated as the electronic device according to the present invention, but the electronic device according to the present invention is not limited to a multilayer ceramic capacitor and can also be a multilayer ceramic board etc. of course.

EXAMPLES

Below, the present invention will be explained further based on detailed examples, but the present invention is not limited to these examples.

Example 1

Preparation of Organic Vehicle

The ethyl cellulose used as the organic binder and the solvent shown in Table 1 were prepared.

Next, 10 parts by weight of the organic binder was made to dissolve in 100 parts by weight of the solvent to prepare an organic vehicle.

Evaluation of Creep Characteristic and Tan δ

The "creep characteristic" and "tan δ" of the obtained organic vehicle were evaluated by observing their fluctuation.

Figure 2:
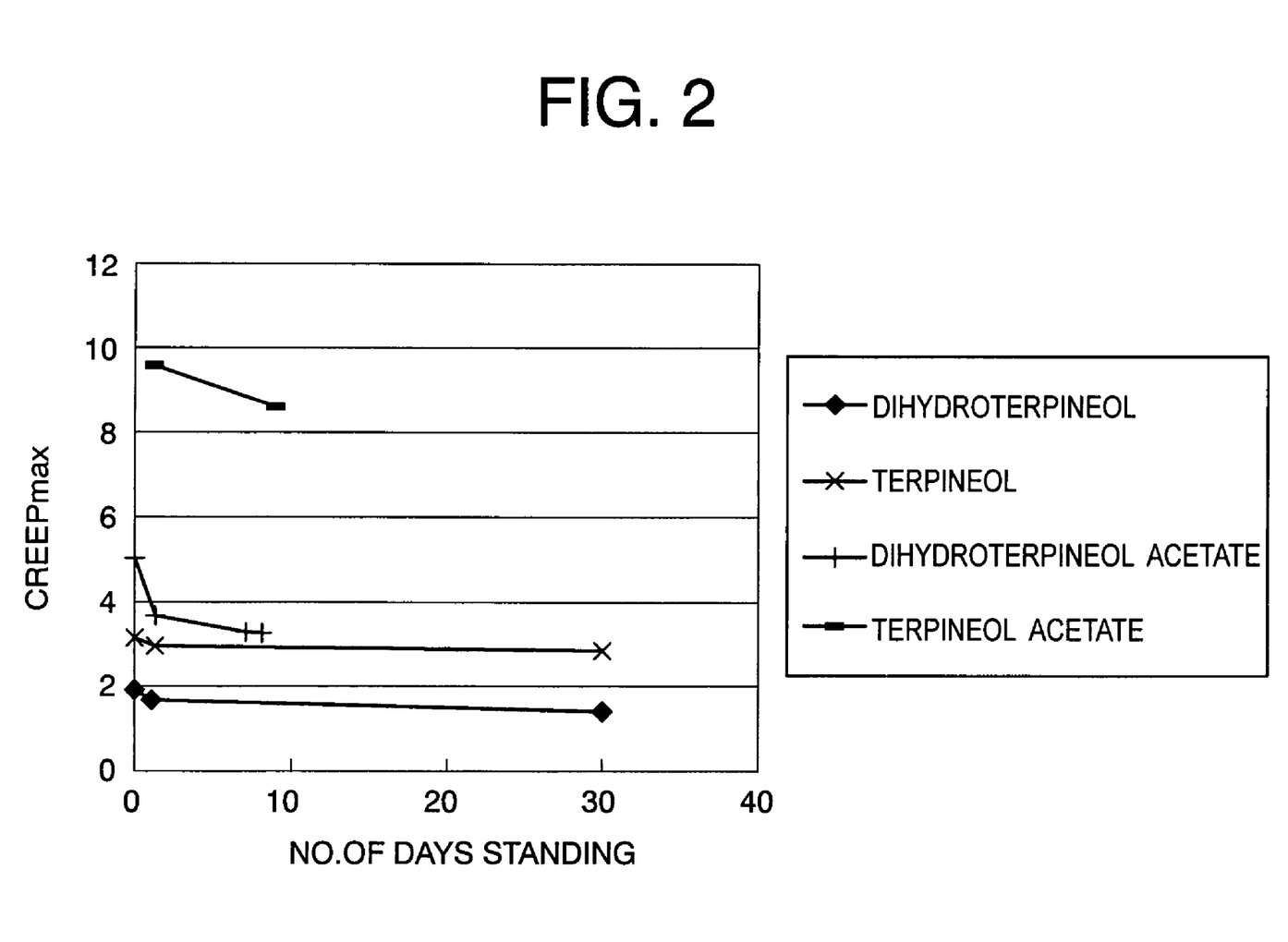
FIG. 2 is a graph showing the creep characteristics for different solvents and showing the fluctuation of the maximum creep value with respect to the number of days of standing.

For the "creep characteristic (creep measurement)", the fluctuation in the maximum creep value when applying a stress of 1 Pa to the obtained organic vehicle was measured by a viscosity/viscoelasticity measurement system (Rheostress RS1, made by Eiko Seiki). The results are shown in FIG. 2. The larger the value of the maximum creep (displacement) with respect to the number of days of standing, the better the creep characteristic, that is, the better the leveling ability, and the higher the solubility (the better the dissolution), it is believed. If the solubility is high, there is little change in viscosity along with time.

As shown in FIG. 2, it could be confirmed that a sample using terpineol acetate is superior in creep characteristic compared with samples using terpineol, dihydroterpineol, and dihydroterpineol acetate.

Figure 3:
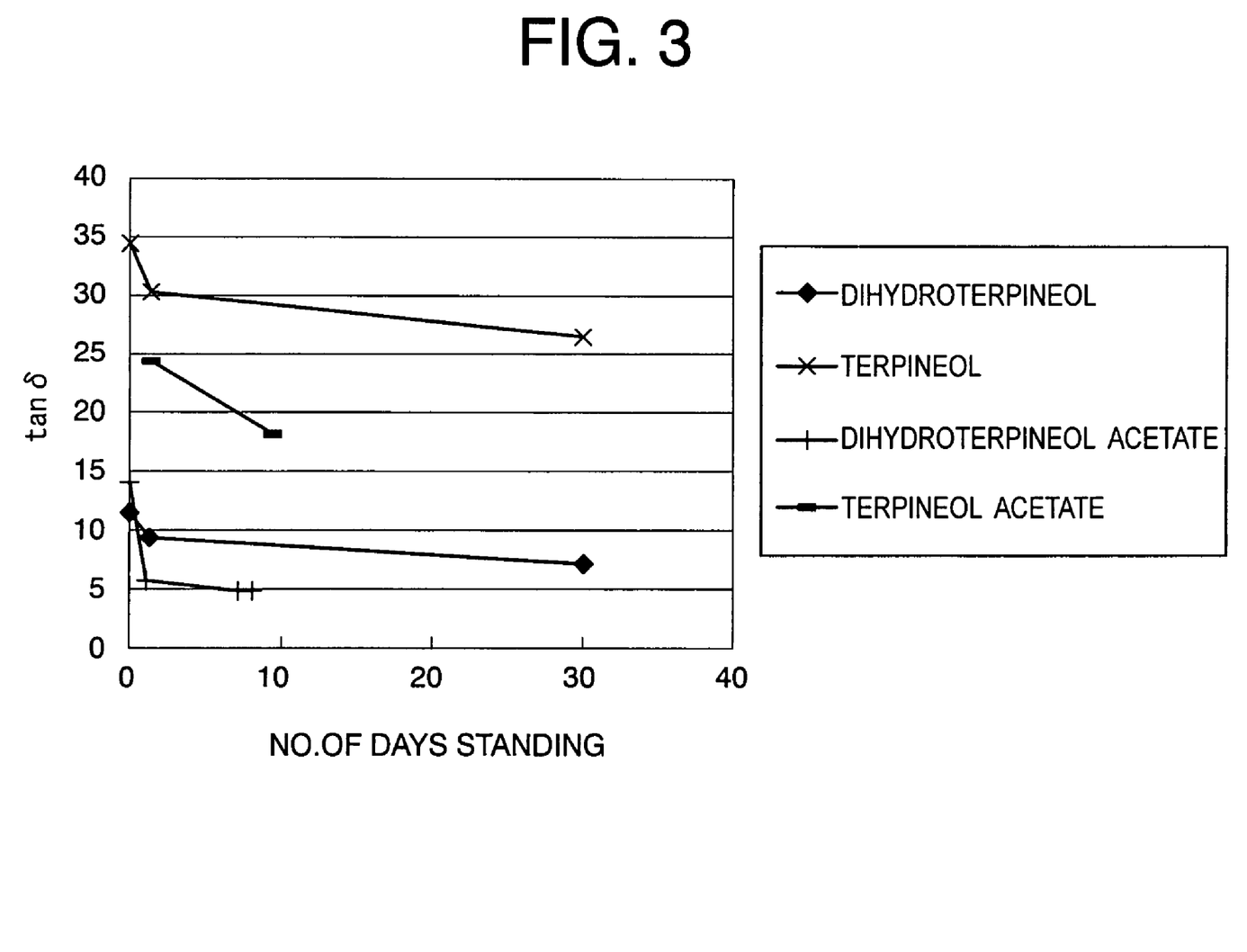
FIG. 3 is a graph showing the tan δ for different solvents and shows the fluctuation of the tan δ value with respect to the number of days of standing.

For the "tan δ (dynamic viscoelasticity measurement)", the fluctuation in the tan δ value when applying a stress of 10 Pa to the obtained organic vehicle was measured by a system similar to the above. The results are shown in FIG. 3. The lower the tan δ value, the more elastic and the harder the leveling, while the higher the tan δ value, the less elastic and the easier the leveling. The larger the tan δ value with respect to the number of days of standing, the better the dynamic viscoelasticity, that is, the better the leveling ability and the higher the solubility, it is believed. If the solubility is high, there is little change in the viscosity along with time. As shown in FIG. 3, it could be confirmed that a sample using terpineol acetate was higher in tan δ compared with samples using nonsoluble dihydroterpineol or dihydroterpineol acetate other than terpineol.

Preparation of Conductive Paste

First, Ni particles with an average particle size of 0.2 µm for use as the conductive powder and the above organic vehicle were prepared. Next, 30 to 70 parts by weight of the organic vehicle was added to 100 parts by weight of the conductive powder and the mixture kneaded by a ball mill to form a slurry to obtain a conductive paste.

Measurement of Viscosity by Days of Standing

The obtained conductive paste was used to measure the viscosity V0 at the time of preparation, the viscosity V1 after standing for 1 day, the viscosity V7 after standing for 7 days, and the viscosity V30 after standing for 30 days using a Brookfield VISCMETR HBDVI+ system under conditions of a spindle ($SC_{4-14}$)/chamber (6R), liquid temperature of 25° C., and slide speed of 4 $S^{-1}$. The results are shown in Table 1.

TABLE 1

| | | Viscosity (%) | | | |
| --- | --- | --- | --- | --- | --- |
| | | No. of days standing | | | |
| Solvent | | 0 | 1 | 7 | 30 |
| Terpineol | Comparative example | 100 | 104 | 108.9 | 109.9 |
| Dihydroterpineol | Comparative example | 100 | 144.2 | 155.8 | 164.4 |
| Dihydroterpineol acetate | Comparative example | 100 | 126.2 | 139.8 | 155.3 |
| Terpineol acetate | Invention example | 100 | 102 | 107 | 108 |

"Viscosity (%)" in the table shows percentage with respect to 0 days of standing.

As shown in Table 1, it could be confirmed that a paste using terpineol acetate has less change in viscosity along with time compared with pastes using terpineol, dihydroterpineol, and dihydroterpineol acetate.

Example 2

Preparation of Dielectric Paste

A $BaTiO_3$-based ceramic powder, polyvinyl butyral (PVB) for use as an organic binder, and methanol for use as a solvent were prepared. Next, with respect to the ceramic powder, 10 wt % of an organic binder and 150 wt % of a solvent were weighed and kneaded by a ball mill to form a slurry and obtain a dielectric paste.

Preparation of Test Samples

PET films were coated with the above dielectric paste by the doctor blade method to a predetermined thickness and dried to form ceramic green sheets with a thickness of 1 µm. Next, the obtained ceramic green sheets were formed with conductive paste containing the terpineol acetate used in Example 1 by the screen printing method in predetermined patterns to obtain ceramic green sheets with electrode patterns of a thickness about 1.0 µm (test samples).

Evaluation of Test Samples

The obtained test samples were used to evaluate the "presence of sheet attack" and the "peelability of the PET film from the ceramic green sheet".

The "presence of sheet attack" was evaluated by visually observing the ceramic green sheets from the sides opposite to the electrode patterns (surfaces contacting PET film) and checking the extent of dissolution of the ceramic green sheets by the degree of deformation or color. As a result, dissolution of the ceramic green sheets could not be observed.

The "peelability of the PET film from the ceramic green sheet" was evaluated by measuring the peeling strength when peeling off the PET films from the test sampless. The peeling strength was measured by attaching a load cell to the end of a 9 cm×20 cm PET-bonded green sheet (margin for start of peeling) by adhesive tape and measuring the load when pulling this upward. As a result, the peeling strength was a suitable value of 5.0 gf or less. Due to this, it is possible to maintain the necessary holding force with respect to the ceramic green sheets and obtain greater efficiency in peeling work.

Example 3

Preparation of Multilayer Ceramic Chip Capacitor Samples

The dielectric paste prepared at Example 2 and the conductive paste prepared at Example 1 were used in the following way to produce samples of the multilayer ceramic chip capacitor 1 shown in FIG. 1.

First, for each sample, a plurality of PET films were coated with a dielectric paste by the doctor blade method to predetermined thicknesses and dried to form ceramic green sheets with thicknesses of 1 μm. In this example, these ceramic green sheets are referred to as the "first green sheets".

Next, the obtained first green sheets were formed with a conductive paste by screen printing in predetermined patterns to obtain a plurality of ceramic green sheets with electrode patterns of thicknesses of about 1 μm. In this example, these ceramic green sheets are referred to as the "second green sheets".

Next, the first green sheets were stacked to a thickness of 150 μm to form a group of green sheets. This group of green sheets further had 250 second green sheets stacked on it. On top of this, further, similar groups of green sheets were stacked and the resultant stack heated and pressed under conditions of a temperature of 70° C. and a pressure of 1.5 ton/cm$^2$ to obtain a green ceramic stack.

Next, the obtained stack was cut to a predetermined size, then treated to remove the binder, fired, and annealed to obtain a sintered body.

Next, the end faces of the obtained sintered body were polished by sand blasting, then an In—Ga alloy was coated to form test electrodes and obtain a multilayer ceramic chip capacitor sample.

The size of the capacitor sample was made 1.6 mm×0.8 mm×0.8 mm. The thickness of each dielectric layer 2 sandwiched between a pair of internal electrode layers was about 1 μm, and the thickness of each internal electrode layer 3 was 1 μm.

Evaluation of Capacitor Samples

The obtained capacitor samples were evaluated for their short-circuit defect characteristics, withstand voltage characteristics (IR characteristics), and the presence of delamination.

For the short-circuit defect characteristic, a tester was used to apply 1.5V. Products failing at 1 MΩ or less were judged to be defective. A failure rate of less than 5% was deemed good.

Regarding the withstand voltage characteristic (IR characteristic), a DC voltage of 12 times the rated voltage (6.3V) was applied for 3 seconds. Capacitor samples with resistances of less than 10$^4$Ω were judged as failed. Batches with average failure rates of less than 1.9% were judged as good.

For the existence of delamination, the inventors polished the fired material and visually examined the stacked state for problems.

The results are shown in Table 2.

TABLE 2

| Solvent | | Short-circuit defect (%) | Average failure rate (%) | Delamination |
|---|---|---|---|---|
| Terpineol | Comparative example | 42.6 | 18.1 | Yes |
| Dihydroterpineol | Comparative example | 31.3 | 12.5 | Yes |
| Dihydroterpineol acetate | Comparative example | 5.0 | 1.9 | No |
| Terpineol acetate | Invention example | 4.3 | 1.2 | No |

As shown in Table 2, it can be confirmed that a capacitor sample produced using a conductive paste containing terpineol acetate is strikingly improved compared with capacitor samples produced using a conductive paste containing terpineol or dihydroterpineol in terms of short-circuit defects, failure rate, and delamination. The above improvement in performance is recognized in the case compared with a capacitor sample produced using a conductive paste containing dihydroterpineol acetate as well. That is, an improvement in reliability could be confirmed for the sample of the example of the present invention compared with the samples of the comparative examples.

While the invention has been described with reference to specific embodiments chosen for purpose of illustration, it should be apparent that numerous modifications could be made thereto by those skilled in the art without departing from the basic concept and scope of the invention.

The invention claimed is:

1. A conductive paste for forming internal electrodes of a multilayer ceramic electronic device, used in combination with ceramic green sheets, the green sheets each including a butyral resin and having a thickness of 5 μm or less, the conductive paste comprising:
    a conductive powder; and
    an organic vehicle, wherein:
    a solvent in said organic vehicle has terpineol acetate as its main ingredient in an amount of 50 to 200 parts by weight with respect to 100 parts by weight of said conductive powder,
    an organic binder in said organic vehicle has ethyl cellulose as its main ingredient and is contained in an amount of 1 to 10 parts by weight with respect to 100 parts by weight of said conductive powder, and
    said conductive powder has Ni or an NI alloy as its main ingredient.

2. A multilayer ceramic electronic device produced using a green ceramic stack comprised of ceramic green sheets, each containing a butyral resin and having a thickness of 5 μm or less, and predetermined patterns of conductive paste containing terpineol acetate in an amount of 50 to 200 parts by weight with respect to 100 parts by weight of a conductive powder and ethyl cellulose in an amount of 1 to 10 parts by weight with respect to 100 parts by weight of said conductive powder alternately stacked in a plurality of layers and
    having internal electrode layers and 3 μm or less dielectric layers.

3. A method of production of a multilayer ceramic electronic device comprising firing a green ceramic stack comprised of ceramic green sheets each containing a butyral resin and having a thickness of 5 µm or less, and predetermined patterns of conductive paste containing terpineol acetate in an amount of 50 to 200 parts by weight with respect to 100 parts by weight of a conductive powder and ethyl cellulose in an amount of 1 to 10 parts by weight with respect to 100 parts by weight of said conductive powder alternatively stacked in a plurality of layers.

4. The method of production of a multilayer ceramic electronic device as set forth in claim 3 wherein the conductive powder contained in said conductive paste has Ni or an Ni alloy as its main ingredient.

* * * * *